United States Patent [19]

Hishiki

[11] Patent Number: 4,931,737
[45] Date of Patent: Jun. 5, 1990

[54] CIRCUIT FOR MEASURING THE CAPACITY OF A BATTERY

[75] Inventor: Teruo Hishiki, Tokyo, Japan
[73] Assignee: U.S. Philips Corporation, New York, N.Y.
[21] Appl. No.: 343,116
[22] Filed: Apr. 25, 1989

[30] Foreign Application Priority Data

Jun. 14, 1988 [JP] Japan ................... 63-146109

[51] Int. Cl.⁵ .............................. G01N 27/26
[52] U.S. Cl. .................... 324/431; 324/428
[58] Field of Search ............ 324/427, 428, 431; 340/636; 320/48

[56] References Cited

U.S. PATENT DOCUMENTS

| | | | |
|---|---|---|---|
| 3,886,442 | 5/1975 | Chiku et al. | 324/427 |
| 3,971,980 | 7/1976 | Jungfer et al. | 324/428 |
| 4,028,616 | 6/1977 | Stevens | 324/431 |
| 4,323,849 | 4/1982 | Smith | 324/428 |
| 4,595,880 | 6/1986 | Patil | 324/431 |
| 4,700,264 | 10/1987 | Kishi et al. | 361/321 |
| 4,816,768 | 3/1989 | Champlin | 324/431 |

FOREIGN PATENT DOCUMENTS

2313566 3/1973 Fed. Rep. of Germany .

*Primary Examiner*—Reinhard J. Eisenzopf
*Assistant Examiner*—Maura K. Regan
*Attorney, Agent, or Firm*—Bernard Franzblau

[57] ABSTRACT

The discharge capacity of a secondary battery, e.g. a Ni-Cd battery, has a maximum value at room temperature and gradually decreases both with an increase and decrease of ambient temperature. The battery discharge capacity also varies inversely with the number of battery charge/discharge cycles of the battery. A circuit for measuring the remaining discharge capacity of the secondary battery comprises a capacitor (23) whose temperature and age-variation characteristics are very similar to those of the discharge capacity of the secondary battery. The current flowing through the battery and motor (13) is detected by a series resistor (17). A voltage follower (20) responds to the detected voltage and drives a resistor (24), so that capacitor (23) is discharged at a rate determined by the resistor (24) current. The capacitor voltage is compared with a predetermined value by a hysteresis comparator (29) which controls the ON/OFF state of a transistor (21) in accordance with the comparison. The comparator output pulses, i.e., the capacitor charge/discharge cycles, are counted by a counter (31).

Since the capacitance variation of the capacitor corresponds to the variation in battery discharge capacity with ambient temperature and also with the time of use, the counter (31) indicates very accurately the remaining battery capacity

11 Claims, 2 Drawing Sheets

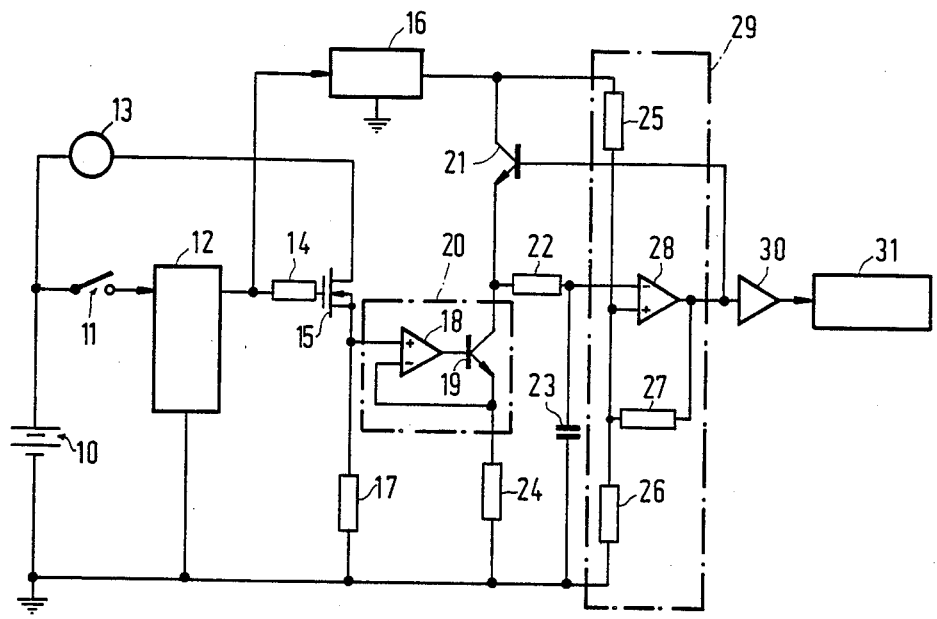
FIG.1
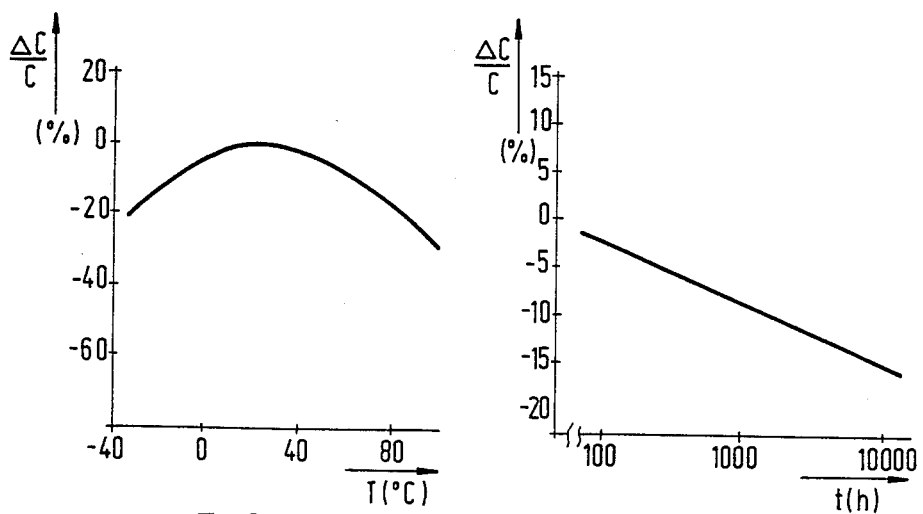
FIG.2
FIG.3

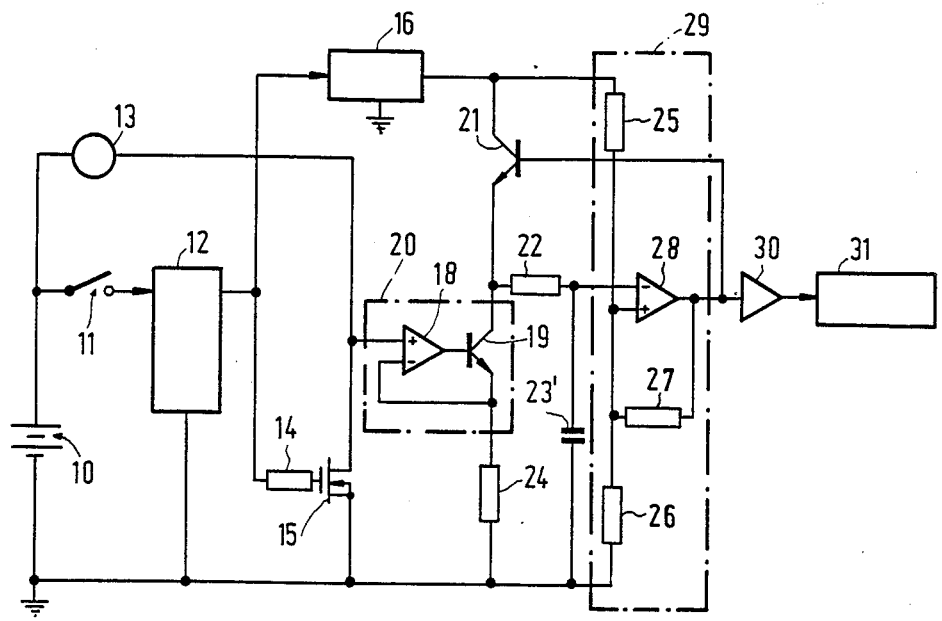
FIG.4
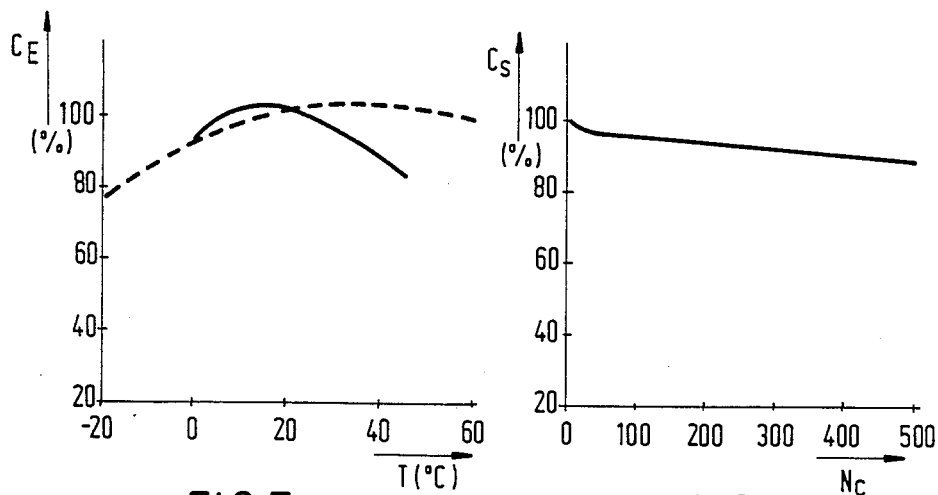
FIG.5
FIG.6

CIRCUIT FOR MEASURING THE CAPACITY OF A BATTERY

FIELD OF THE INVENTION

The present invention relates generally to a circuit for measuring the capacity of a battery, and more particularly to such a circuit which is suitable for use in measuring the energy capacity of a battery comprising detection means for detecting a current flowing through the battery and an integration circuit for integrating the output of the detection means, the measuring circuit measuring the capacity of the battery in accordance with the output of the integration circuit.

PRIOR ART

A measuring circuit of this kind is used, for example, in an electric or an electronic apparatus having a rechargeable battery, such as a rechargeable shaver, to obtain the amount of energy that is charged into or discharged from the battery. For example, a measuring circuit of the conventional type is known in which the energy charged into or discharged from a battery is obtained based on the measurement of a charge or a discharge time. In another example of the conventional measuring circuits, the amount of energy charged into or discharged from a battery is obtained by integrating a measured charge or discharge current. In the latter measuring circuit, the charge and discharge currents are measured based on a voltage appearing across a resistor which is connected in series with the battery. More specifically, the voltage across the resistor is amplified and then integrated, and each time the integration value reaches a predetermined value a pulse is produced with the integration value being reset to zero. The above operation is repeated while the battery is charged or discharged, so that the energy charged or discharged can be measured by counting the pulses thus produced. An example of such a measuring circuit is disclosed in German Patent Application No. 2,313,566.

It has been known that a rechargeable battery, as a Ni-Cd battery, has such a characteristic such that the energy capacity thereof varies with a variation of the ambient temperature as shown, for example, in FIG. 5. This figure shows the relative energy capacity $C_E$ as a function of its temperature T. More specifically, the energy capacity of the battery is larger in a temperature range above room temperature, and decreases when the ambient temperature decreases below room temperature, as can be appreciated from the discharge characteristics indicated by the dotted line in FIG. 5. It will also be appreciated from the charge characteristic, indicated by a solid line in FIG. 5, that the energy capacity of the battery takes the maximum value at around the room temperature and gradually decreases with the increase or decrease of the ambient temperature from the room temperature. Thus, when both of the charge and discharge characteristics are taken into consideration, the energy capacity of a battery becomes a maximum at approximately the room temperature and decreases with the increase or decrease of the temperature therefrom. In order to measure accurately the charge or discharge energy of a battery based on an integral value of charge and discharge currents therethrough, it will thus be necessary to compensate for the variation of battery capacity with the variation of its ambient temperature.

The energy capacity of a rechargeable battery of the above type also gradually decreases with the increase of the number of charging and discharging operations, that is to say, with the lapse of time of usage. This is illustrated in FIG. 6 which shows relative static capacity $C_{Sn}$ as a function of the number of charge and discharge cycles $N_C$. Therefore, it is also necessary to take into consideration this decrease in energy capacity for a more accurate measurement of energy capacity of a battery.

It is therefore an object of the invention to provide a measuring circuit which is capable of accurately measuring the amount of energy charged into and discharged from a battery over a wide ambient temperature range without the provision of a specific temperature sensor or the like and also without the need for later correction, for example, by a software program stored in a micro-computer.

It is another object of the invention to provide a measuring circuit which is capable of accurately measuring the amount of energy charged into or discharged from a battery over a long period of time of usage by means of a simple circuit construction and irrespective of aged-variation in the energy capacity of the battery.

SUMMARY OF THE INVENTION

According to the invention, there is provided a circuit for measuring the energy capacity of a battery comprising detection means for detecting a current flowing through the battery and an integration circuit for integrating the output of the detection means, wherein the measuring circuit measures the capacity of the battery in accordance with the output of the integration circuit, characterized in that a circuit element for determining an integration time constant of the integration circuit has a temperature characteristic which substantially compensates for the temperature characteristic in the energy capacity of the battery.

In a the measuring circuit of the above structure, the integration time constant of the integration circuit varies with the variation of the ambient temperature such that the temperature-dependent variation in the capacity of the battery is compensated. The indication of the amount of energy charged into or discharged from the battery obtained in accordance with the integration result corresponds therefore very accurate with the actual state-of-charge irrespective of the variation of the ambient temperature.

The same principle can be applied to compensate for the aging of the battery, if the circuit element in the measuring circuit is selected to have an age-variation characteristic which substantially compensates for the age-variation in the energy capacity of the battery. The amount of energy charged to or discharged from the battery can then be measured more accurately.

BRIEF DESCRIPTION OF THE DRAWINGS

FIG. 1 is a circuit diagram of a circuit for measuring the amount energy discharged from a battery incorporated in an electric shaver showing an embodiment of the measuring circuit according to the invention;

FIG. 2 is a graph showing a temperature characteristic of the capacitance of the capacitor 23 in the embodiment of FIG. 1;

FIG. 3 is a graph showing an age-variation characteristic of the capacitance of the capacitor 23 in the embodiment of FIG. 1;

FIG. 4 shows a circuit diagram modified with respect to the embodiment of FIG. 1;

FIG. 5 is a graph showing the temperature characteristic of a Ni-Cd battery; and FIG. 6 is a graph showing the age-variation characteristic of a Ni-Cd battery.

DETAILED DESCRIPTION OF THE INVENTION

FIG. 1 shows an example of a circuit diagram of an embodiment of the capacity measuring circuit in accordance with the present invention, which embodiment is designed as a circuit for obtaining the amount of energy discharged from a battery incorporated in a rechargeable-battery type electric shaver.

In FIG. 1 a rechargeable battery 10 is shown, for example, a Ni-Cd type battery having a nominal output voltage of 2.4 volts. The negative terminal of the battery is connected to ground. The positive output terminal of the battery 10 is connected to one of the terminals of a motor 13 for driving a cutting blade of the electric shaver and is connected via switch 11 to a voltage converter 12. This converter 12 is provided for elevating or stepping-up an input voltage thereof and has an output terminal which is connected via a resistor 14 to a gate of an FET 15. The same output terminal is also connected to an input terminal of a voltage regulator 16. The drain of the FET 15 is connected to the other terminal of the motor 13, and the sourcce of the FET 15 is grounded via a resistor 17 of a low resistance value. The source of the FET 15 is also connected to an input terminal of a voltage follower 20 which comprises an operational amplifier 18 and an NPN transistor 19. The collector of the transistor 19 is connected to the emitter of an NPN transistor 21 and is connected to ground via a resistor 22 and a capacitor 23. The emitter of the transistor 19 is grounded through a resistor 24. The transistor 21 has a collector connected to an output terminal of the aforementioned voltage regulator 16. The junction point between the resistor 22 and the capacitor 23 is connected to an input terminal of a hysteresis comparator 29 which comprises resistors 25, 26 and 27 and an operational amplifier 28. An output terminal of this hysteresis comparator 29 is connected to the base of the transistor 21 and to the input terminal of a buffer amplifier 30. The output signal (a pulse signal) provided by the hysteresis comparator 29 is thereby amplified and is then counted by a counter 31.

In this embodiment, the capacitor 23 is selected so that the thermal and age-variation characteristics thereof compensate for the thermal and age-variation characteristics, respectively, of the battery 10. More specifically, the capacitor 23 has a capacitance which becomes maximum at about the room temperature and decreases with either the increase or the decrease of the ambient temperature therefrom, as seen from its thermal characteristic of the static capacitance in FIG. 2. This Fig. shows the relative change in capacity ΔC/C as a function of the temperature T. This temperature characteristic corresponds closely to that of the energy capacity of the battery 10 shown in FIG. 5. A multilayer ceramic capacitor, for example, is suitable for use as the capacitor having such a temperature characteristic. In addition, the capacitance of the capacitor 23 preferably gradually decreases with the lapse of time of usage, as indicated by the aged-variation characteristic in static capacitance in FIG. 3. FIG. 3 shows the relative variation of the capacitance ΔC/C as a function of the time of usage, t. This characteristic corresponds to the age-variation characteristic of the battery 10 shown in FIG. 6. The aforesaid multilayer ceramic capacitor also has an age-characteristic similar to that shown in FIG. 3.

The operation of the circuit shown in FIG. 1 will now be described.

When the switch 11 is closed by the user, the voltage converter 12 steps up the output voltage of the battery 10 and supplies the stepped-up voltage to the gate of the FET 15. Consequently, the FET 15 is brought into the conducting state to drive the motor 13, so that a motor current flows through the resistor 17. Zthe voltage which then appears across the resistor 17 is applied through the voltage follower 20 to the resistor 24. Therefore, a current proportional in value to the current through the motor 13 flows through the resistor 24. If it is assumed that the transistor 21 is in a cut-off state, the electric charge on the capacitor 23 is discharged by the current flowing through the resistor 24, so that the voltage across the capacitor 23 decreases at a rate proportional to the magnitude of this current. When this voltage becomes less than the lower threshold value of the hysteresis comparator 29, the transistor 21 is brought into a conductive state so that the capacitor 23 is rapidly charged through the transistor 21 and the resistor 22. When the voltage across the capacitor 23 exceeds the upper threshold value of the comparator 29, the transistor 21 is again brought into the non-conductive state. The above operation is repeated as long as the switch 11 is closed.

In this manner, a pulse signal having a frequency corresponding to the motor current is produced at the output terminal of the comparator 29, which pulse signal is then counted by the counter 31. In this case, the frequency of the above pulse signal for the same amount of motor current becomes lowest when the ambient temperature is at about the room temperature as can be seen from the temperature characteristic of the capacitor 23 shown in FIG. 2, and increases as the ambient temperature increases or decreases therefrom. The count value obtained at the counter 31 therefore represents the amount of energy discharged from the battery 10 in which the variation in discharge capacity thereof with the variation in ambient temperature is compensated.

As described earlier, the static capacitance of the capacitor 23 gradually decreases with the lapse of time of usage. Therfore, as the number of cycles of usage increases, the frequency of the pulse signal increases even if the motor current keeps the same value. Thus, in the amount of energy discharged from the battery 10 as represented by the count value at the counter 31, the decrease in energy capacity of the battery 10 by the age-variation characteristic thereof has been compensated.

FIG. 4 shows a modified form of the above-described embodiment.

In the measuring circuit shown in FIG. 4, no resistor is provided within the current path of motor 13. Alternatively, a voltage appearing between the drain and the source of FET 15 for switching the motor current is supplied to a voltage follower 20. Since the drain-to-source voltage is proportional to the amplitude of the motor current, the current flowing through the resistor 24 is also proportional to the motor current. The operation and the structure of the other portions of this circuit are almost the same as those of the circuit of FIG.

1. It should be noted that it is preferable that the temperature characteristic of capacitor 23' be selected to take the temperature characteristic of the drain-to-source voltage of the FET 15 into account.

In the above embodiments, only the circuits for measuring the amount of discharged energy of batteries are shown. However, it will be evident that the circuits according to the present invention can also be used for measuring the amount of energy charged into batteries, for example, by causing a charging current of the battery 10 to flow through the resistor 17 in FIG. 1 and by replacing the capacitor 23 with a capacitor having a capacitance such that the temperature characteristic thereof substantially compensates for the temperature-dependent charging characteristic of the battery 10.

It will also be possible to achieve a temperature compensation similar to that performed in the above-described embodiments by the use of a normal capacitor in place of the capacitor 23 and, instead of this, by the use, in place of the resistor 24, of a resistor having a temperature characteristic such that the resistance value becomes maximum at about the room temperature.

As described above, with the measuring circuit according to the present invention, in which the current flowing through the battery is detected and the charge or discharge energy is measured in accordance with the result of the integration of the detected current, the circuit element for determining the integration time constant is selected to have a temperature characteristic such that it compensates for the temperature characteristic of the battery. The charged and discharged energy can therefore be measured very accurately without the need for a separate temperature compensation with a specific temperature sensor.

In addition, it is possible to measure the charged and discharged energy very accurately for a long period of time by arranging the circuit such that the circuit element has an age-variation characteristic which compensates for the age-variation characteristic of the battery.

I claim:

1. A circuit for measuring the energy capacity of a battery having a temperature characteristic such that the energy capacity of the battery varies as a given function of temperature, said measuring circuit comprising; detection means for detecting a current flowing through the battery, an integration circuit for integrating an output of the detection means, and means for measuring the capacity of the battery in accordance with an output of the integration circuit, characterized in that said integration circuit includes a circuit element for determining an integration time constant, said circuit element having a temperature characteristic which substantially compensates for said temperature characteristic in the capacity of said battery.

2. A circuit for measuring the energy capacity of a battery having a given age-variation characteristic for the battery capacity, said measuring circuit comprising; detection means for detecting a current flowing through the battery, an integration circuit for integrating an output of the detection means, and means for measuring the capacity of the battery in accordance with an output of the integration circuit, characterized in that said integration circuit includes a circuit element for determining an integration time constant, said circuit element having an age-variation characteristic which substantially compensates for said age-variation characteristic in the capacity of said battery.

3. A circuit for measuring the energy capacity of a battery having a given temperature characteristic and a given age-variation characteristic for the battery capacity, said measuring circuit comprising; detection means for detecting a current flowing through the battery, an integration circuit for integrating an output of the detection means, and means for measuring the capacity of the battery in accordance with an output of the integration circuit, characterized in that said integration circuit includes a circuit element for determining an integration time constant, said circuit element having a temperature characteristic which substantially compensates for the temperature characteristic of said battery and an age-variation characteristic which substantially compensates for the age-variation characteristic in the capacity of said battery.

4. A measuring circuit according to claim 1, 2 or 3, wherein circuit element comprises a capacitive element.

5. A measuring circuit according to claim 4, wherein said detection means comprises a resistor serially connected to said battery, said integration circuit including means for causing said capacitive element to be charged or discharged in accordance with a voltage across said resistor, and wherein said measuring circuit further comprises:
comparison means for comparing a voltage appearing across said capacitive element with a predetermined voltage value to cause said capacitive element to be discharged or charged in accordance with a result of the comparison; and
counter means for counting the charging-and-discharging cycles of said capacitive element.

6. A measuring circuit according to claim 4, wherein said detection means comprises a semiconductor switching element serially connected to said battery, said integration circuit including means for causing said capacitive element to be charged or discharged in accordance with a voltage across said semiconductor switching element, and wherein said measuring circuit further comprises:
comparison means for comparing a voltage appearing across said capacitive element with a predetermined voltage value to cause said capacitive element to be discharged or charged in accordance with a result of the comparison; and
counter means for counting the charging-and-discharging cycles of said capacitive element.

7. A measuring circuit according to claim 1, 2 or 3, wherein said circuit element comprises a resistive element.

8. A measuring circuit according to claim 7 wherein said detection means comprises a resistor serially connected to said battery, said integration circuit including means for causing a capacitor of the integration circuit to be charged or discharged via said resistive element and in accordance with a voltage across said resistor, and wherein said measuring circuit further comprises:
comparison means for comparing a voltage appearing across said capacitor with a predetermined voltage value to cause said capacitor to be discharged or charged in accordance with a result of the comparison; and
counter means for counting the charging-and-discharging cycles of said capacitor.

9. A measuring circuit according to claim 7 wherein said detection means comprises a semiconductor switching element serially connected to said battery, said integration circuit including means for causing a capacitor of the integration circuit to be charged or discharged via said resistive element in accordance with a voltage across said semiconductor switching element, and wherein said measuring circuit further comprises:

comparison means for comparing a voltage appearing across said capacitor with a predetermined voltage value to cause said capacitor to be discharged or charged in accordance with a result of the comparison; and counter means for counting the charging-and-discharging cycles of said capacitor.

10. A measuring circuit as claimed in claims 1 or 2 further comprising means for connecting a motor and a switchable transistor in series circuit with said detection means to terminals of said battery.

11. A measuring circuit as claimed in claims 1 or 2 further comprising a hysteresis comparator having an input coupled to an output of said integration circuit, a switchable transistor coupled between a source of DC voltage and an input of the integration circuit, and means coupling an output of said comparator to a control electrode of the switchable transistor.

* * * * *